United States Patent [19]
Fahey et al.

[11] Patent Number: 5,473,623
[45] Date of Patent: Dec. 5, 1995

[54] LASER DIODE DRIVER CIRCUIT

[75] Inventors: William D. Fahey, Cupertino; Theodore J. Netoff, Milpitas; Giang V. Dao, San Pablo; Richard Saasta, Redwood City, all of Calif.

[73] Assignee: Quantic Industries, Inc., San Carlos, Calif.

[21] Appl. No.: 169,822

[22] Filed: Dec. 17, 1993

[51] Int. Cl.$^6$ ...................................................... H01S 3/00
[52] U.S. Cl. ...................................................... 372/38
[58] Field of Search .................................... 372/38, 25

[56] References Cited

U.S. PATENT DOCUMENTS

| | | | |
|---|---|---|---|
| 3,946,335 | 3/1976 | De Loach, Jr. et al. | 331/94.5 |
| 3,986,117 | 10/1976 | Fry et al. | 324/133 |
| 4,141,297 | 2/1979 | Sellwood | 102/206 |
| 4,237,427 | 12/1980 | Holland | 331/94.5 |
| 4,238,707 | 12/1980 | Malissin et al. | 315/175 |
| 4,348,648 | 9/1982 | Childs | 372/29 |
| 4,369,707 | 1/1983 | Budde | 102/202.2 |
| 4,621,578 | 11/1986 | Vallieres et al. | 102/202.5 |
| 4,745,610 | 5/1988 | Yoshimawa | 372/38 |
| 4,771,431 | 9/1988 | Nakazawa et al. | 372/38 |
| 4,827,116 | 5/1989 | Takagi et al. | 372/38 |
| 4,856,011 | 8/1989 | Shimada et al. | 372/38 |
| 4,924,473 | 5/1990 | Burgyan et al. | 372/38 |
| 5,138,946 | 8/1992 | Soltz et al. | 102/201 |
| 5,140,603 | 8/1992 | Anderson, Jr. et al. | 372/38 |
| 5,173,958 | 12/1992 | Folsom et al. | 385/36 |
| 5,187,713 | 2/1993 | Kwa | 372/26 |
| 5,204,490 | 4/1993 | Soltz et al. | 102/201 |
| 5,206,455 | 4/1993 | Williams et al. | 102/201 |
| 5,218,612 | 6/1993 | Wandel | 372/38 |
| 5,260,956 | 11/1993 | Inaba et al. | 372/38 |

FOREIGN PATENT DOCUMENTS

| | | | |
|---|---|---|---|
| 0402622A1 | 12/1990 | European Pat. Off. | B60R 21/32 |
| 4026697A1 | 3/1992 | Germany | B60R 21/32 |
| 4224477 | 2/1993 | Germany | B60R 16/02 |
| 1520036 | 8/1978 | United Kingdom | F42C 11/04 |
| 1598590 | 9/1981 | United Kingdom | F42C 11/00 |

OTHER PUBLICATIONS

"Radio Frequency Attenuating Connector", Quantic Industries, Inc. Jan. 1992.
U.S. Statutory Invention Registration No. H322, published on Aug. 4, 1987 to Simmons, U.S.

Primary Examiner—Rodney B. Bovernick
Assistant Examiner—Robert E. Wise
Attorney, Agent, or Firm—Wilson, Sonsini, Goodrich & Rosati

[57] ABSTRACT

The invention relates to providing a reliable means for controlling a laser diode in an initiator for starting a pyrotechnic reaction in an ordnance. The circuit has an array of capacitors to tune the coupling of the input signal to provide for more efficient power transfer from an electrical energy system. The circuit contains a full wave rectifier to provide DC power to operate the circuit. The circuit also contains a two stage current amplifier that is controlled by a differential amplifier. The differential amplifier compares a voltage proportional to the current flowing through the controlled laser diode with a reference voltage. The differential amplifier controls the current amplifier to limit the current that can pass through the laser diode. The circuitry that provides the reference voltage has the ability to drive the reference voltage to zero when the input signal is removed or is too low to drive the circuit properly. This prohibits current spikes from developing in the laser diode when the circuit is shutting down. The reference voltage circuitry also turns the laser diode on relatively slowly to allow the current control circuitry to become stable. This prevents damaging current overshoots that otherwise could occur at the time the laser diode is turned on.

22 Claims, 3 Drawing Sheets

LASER DIODE DRIVER CIRCUIT

BACKGROUND OF THE INVENTION

The present invention relates to the field of electrical circuits, and more particularly, to the field of circuits for controlling a laser diode, for example, in initiating ordnance.

Initiating a pyrotechnic reaction in an ordnance with an electrical signal requires several steps. First, an electrical energy system provides electrical energy to an initiator to start the reaction. The initiator converts that electric energy to thermal energy which heats the ordnance or pyrotechnic material. When exposed to the thermal energy, the ordnance or pyrotechnic material undergoes a pyrotechnic reaction, and rapidly generates gases and hot particles.

For safe operation, the electrical energy system and the initiator must be designed to protect the ordnance from phenomena like radio frequency (RF) fields, electrostatic discharge (ESD), or lightning that can inadvertently start a reaction. Additionally, to ensure that the initiator is constructed properly, it is desirable to nondestructively test the initiator.

An infrared laser diode converts electrical energy into infrared energy when an electrical current flows through it. This makes an infrared laser diode an interesting candidate for a device to convert an electrical signal to energy for initiating ordnance. Unfortunately, high power infrared laser diodes suitable for initiating ordnance are easily damaged by current spikes, such as those that can occur if the laser diode is not turned on or turned off properly. More critically for ordnance applications, laser diodes are low voltage devices, making them susceptible to inadvertent activation by phenomena like ground fault currents. Laser diodes are also susceptible to RF fields, ESD and lightning. Using conventional circuitry to control a laser diode can damage the laser diode during initiator testing or expose the ordnance to inadvertent ignition. Damage during testing would compromise the ability of the laser diode to operate correctly when the initiator is used with an ordnance. Igniting the ordnance prematurely is clearly undesirable.

To help prevent inadvertent ignition, initiators can be indirectly connected to electrical energy systems by a Radio Frequency Attenuating Coupler (RFAC). This involves placing the initiator inside of a Faraday cage, and transferring power from the electrical energy system to the inside of the Faraday cage by magnetic flux. A transformer within the Faraday cage can convert the magnetic flux into a current that can be used to drive a conventional electrical initiator or, via electronic circuits, a laser diode or other device. However, this method of transferring power has substantial losses.

SUMMARY OF THE INVENTION

The present invention provides a circuit for preventing current spikes from reaching a device such as a laser diode. As one application, this allows laser diodes to be used reliably to initiate a pyrotechnic reaction in an ordnance.

The present invention also increases the efficiency of the power transferred from the electrical energy system to the initiator. This reduces the amount of power that the electrical energy system needs to supply to initiate an ordnance reliably.

DETAILED DESCRIPTION OF THE PREFERRED EMBODIMENTS

Figure 1:
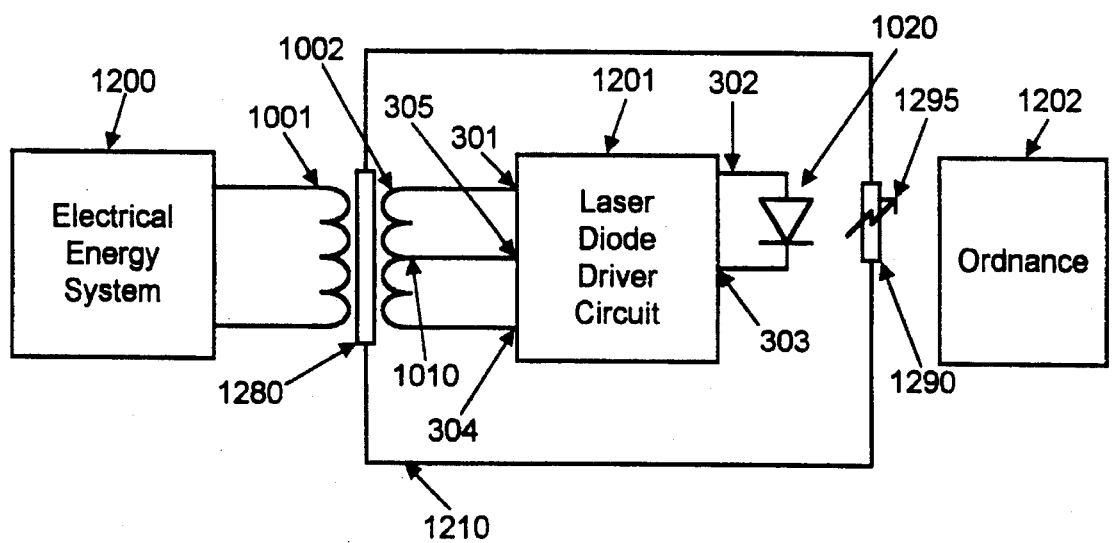
FIG. 1 is a block diagram of a system to control initiation of an ordnance using a laser diode.

FIG. 1 is a block diagram of a system to control the initiation of a pyrotechnic reaction in an ordnance. Electrical energy system 1200 provides an alternating current signal to transformer primary winding 1001 when it is desired to initiate ordnance 1202. Power reaches the laser diode driver circuit 1201 by magnetic flux that transfers energy from transformer primary winding 1001 to transformer secondary winding 1002 with a center tap 1010. Faraday cage 1210 isolates the circuits and the laser diode within the Faraday cage from phenomena like RF fields, ESD, lightning, and ground fault loops. Faraday cage 1210 includes an input port 1280 composed of an alloy of copper and nickel that allows magnetic flux to pass into the Faraday cage. This allows transfer of energy into the cage. Faraday cage 1210 in some cases includes an output port 1290 that allows optical energy 1295 to exit the Faraday cage and ignite ordnance. In other cases, the ordnance is within Faraday cage 1210, and no output port 1290 is required. Transformer primary winding 1001 is built separately from transformer secondary winding 1002 to facilitate using Faraday cage 1210. The details of using separated transformer windings with a Faraday cage is disclosed in U.S. Pat. No. 4,141,297 to Sellwood, the disclosure of which is hereby incorporated by reference.

The taps of transformer secondary winding 1002 are connected to laser diode driver circuit 1201 as shown. The laser diode driver circuit 1201 provides current to laser diode 1020. Laser diode 1020 provides energy that can be directed onto ordnance 1202 directly or by fiber optics or other means. The energy provided by laser diode 1020 initiates a pyrotechnic reaction in ordnance 1202.

Figure 2:
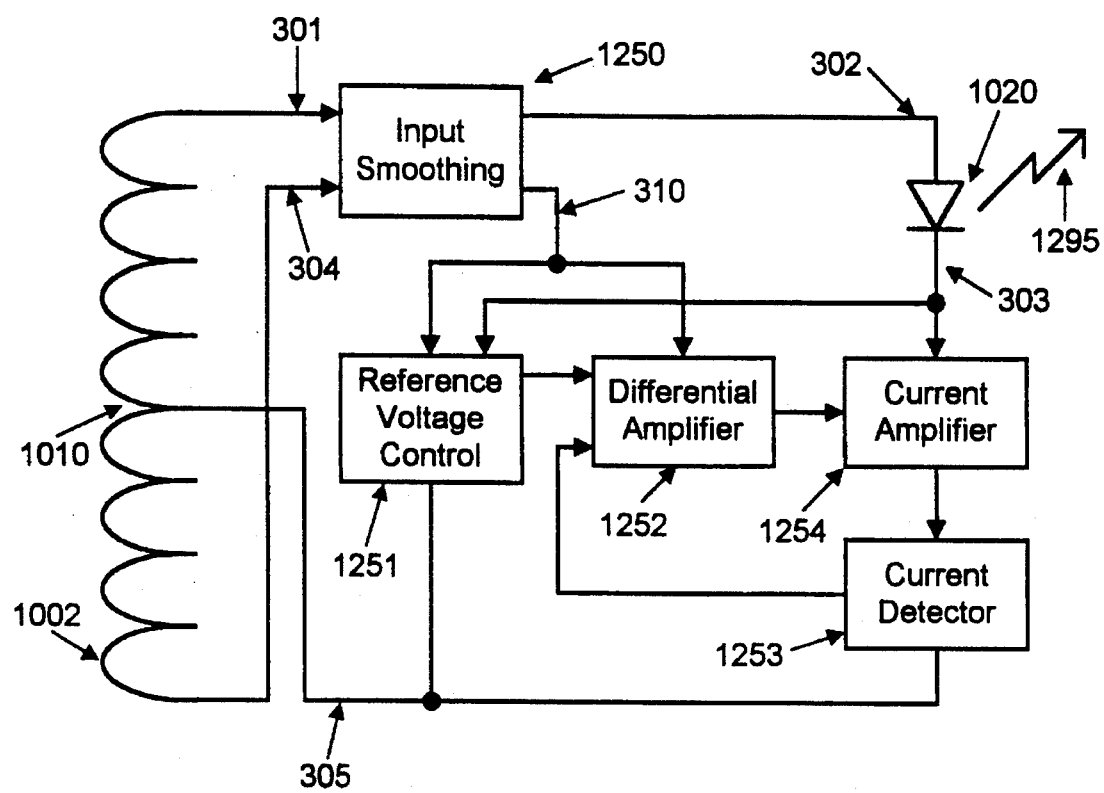
FIG. 2 is a block diagram of an embodiment of the present invention as used to control a laser diode.

FIG. 2 shows a block diagram of a laser diode driver circuit 1201 connected to transformer secondary winding 1002. Input Smoothing circuit 1250 rectifies the waveform and filters the waveform provided by transformer secondary winding 1002. Reference voltage control circuit 1251 provides a proper reference voltage for controlling the current passing through laser diode 1020, or any other device attached to connections 302 and 303. Current detector 1253 provides a signal proportional to the current passing through laser diode 1020 and current amplifier 1254. Differential amplifier circuit 1252 compares the reference voltage provided by reference voltage control circuit 1251 to the signal provided by current detector 1253 to determine the appropriate current level. Differential amplifier circuit 1252 provides a voltage to current amplifier 1254 to control the current passing through laser diode 1020.

Figure 3:
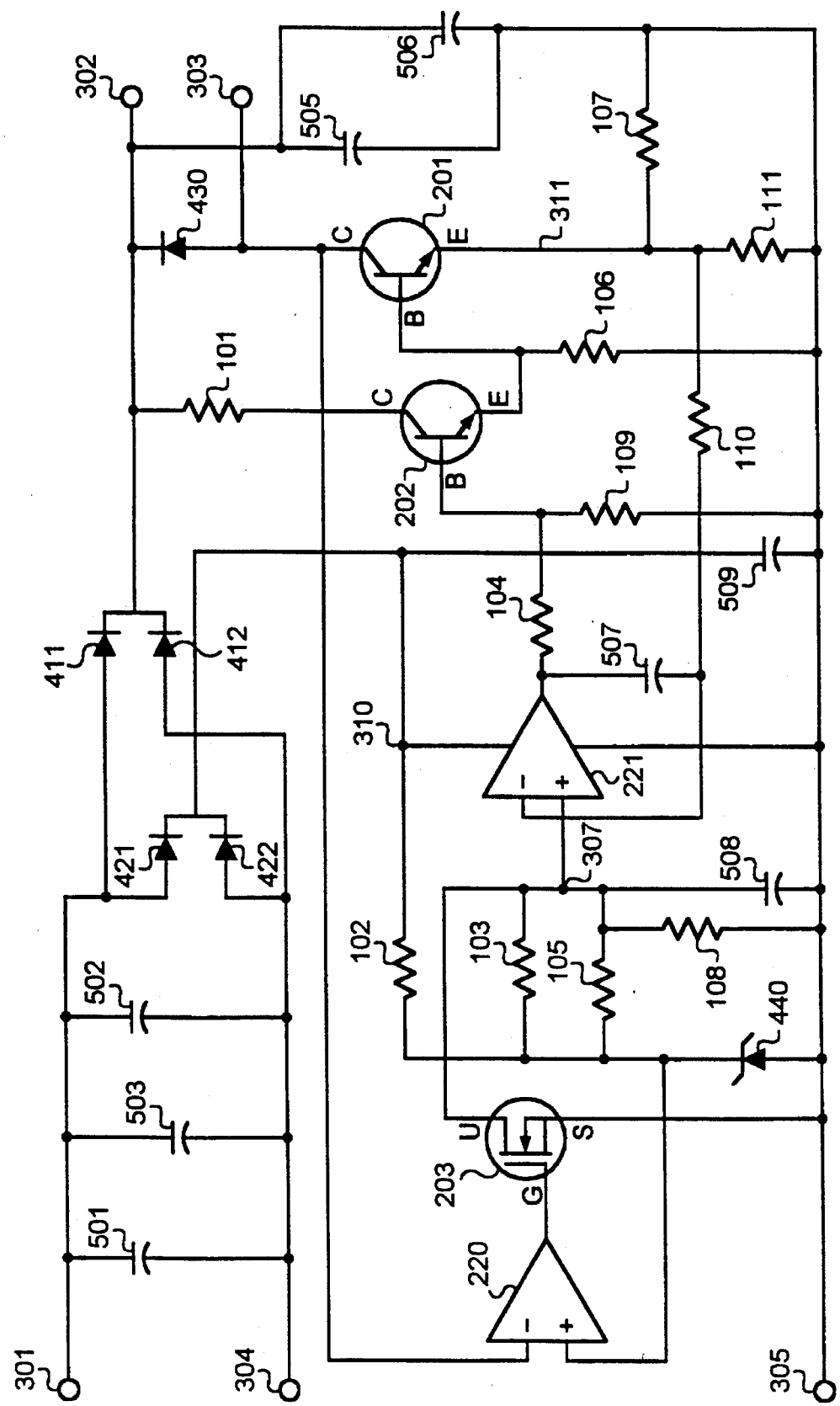
FIG. 3 is a circuit schematic of an embodiment of the present invention.

FIG. 3 shows an embodiment of laser diode driver circuit 1201. The output of transformer secondary winding 1002 is applied to the driver circuit's input connections 301, 304 and 305. Rectifier diodes 411 and 412 combine with capacitors 505 and 506 to provide DC power to the laser diode. In one embodiment, capacitors 505 and 506 are each 33 microfarads with 10% variation and with a 16 volt rating. Rectifier diodes 411 and 412 are rated at 40 volts and 6 amps. These Rectifier diodes are available from Motorola.

Schottky rectifier diodes 421 and 422 combine with capacitor 509 to provide DC power to operational amplifiers 220 and 221, and voltage reference diode 440. In one embodiment, capacitor 509 is 0.1 microfarads with 10% variation, and is rated at 50 volts. In one embodiment, Schottky rectifier diodes 421 and 422 are rated at 40 volts and 40 milliamps. These diodes are available from Siemens.

Capacitors 501, 502, 503, 505, 506, and 509, and diodes 411, 412, 421, and 422 together form input smoothing circuit 1250.

Capacitors 501, 502 and 503 function as tuning elements for the transformer secondary winding 1002 to increase the power transferred from the transformer primary winding 1001 to transformer secondary winding 1002. One embodiment has capacitor 501 with 0.1 microfarads, plus or minus 10%, and is rated at 50 volts. One embodiment has capacitor 502 with 0.15 microfarads, plus or minus 10%, and is rated at 50 volts. One embodiment has capacitor 503 with 0.15 microfarads, plus or minus 10%, and is rated at 50 volts. Together, capacitors 501, 502 and 503 form a reactive load balancing circuit.

The laser diode 1020's anode is attached to connection 302 and laser diode 1020's cathode is attached to connection 303. Laser diode 1020 has a maximum current that can safely flow through it. If the current passing through laser diode 1020 exceeds that maximum, then laser diode 1020 can be destroyed. In one embodiment, the laser diode is a C86118E from EG&G of Montreal, Canada. It is a 1 watt laser diode that can support currents up to 3 amps for 10 milliseconds.

Diode 430 provides reverse bias protection for laser diode 1020. In one embodiment, diode 430 is a 10MQ040 that is rated for 40 volts and 1.1 amps. It is available from International Rectifier.

Transistor 201 is biased with resistor 106. Transistor 201 acts to provide a constant current flow from connection 302 through laser diode 1020 back to connection 303 through transistor 201 and the parallel combination of resistors 107 and 111. By providing a constant current, transistor 201 helps prevent too much current from flowing through laser diode 1020. In one embodiment, transistor 201 is a MJD44H11 from Motorola. It is a NPN transistor rated at 80 volts and 8 amps. In one embodiment, resistors 107 and 111 are each 0.2 ohms with 5% variation and are rated at 1 watt. Resistors 107 and 111 in parallel form current detector 1253.

Transistor 202 acts to amplify an input signal at node 309 to control transistor 201. Resistors 101, 106, and 109 act to bias transistor 202 to drive transistor 201. In one embodiment, resistor 101 is 18 ohms with 5% variation and is rated at 0.5 watts. In one embodiment, resistor 106 is 1,500 ohms with 5% variation, and is rated at 0.1 watts. In one embodiment, resistor 109 is 1,500 ohms with 5% variation, and is rated at 0.1 watts. In one embodiment, transistor 202 is BF720 manufactured by Siemens. It is a NPN transistor rated at 300 volts and 100 milliamps.

Transistors 201 and 202, resistors 101, 106 and 109 together form current amplifier 1254.

Capacitor 507 and resistors 104 and 110 act as a filter and gain control for smoothing the output produced by operational amplifier 221. In one embodiment, resistor 104 is 50 ohms with 5% variation, and is rated at 0.1 watts. In one embodiment, resistor 110 is 2,200 ohms with 5% variation and is rated at 0.1 watts. In one embodiment, capacitor 507 is 27 picofarads with 5% variation, and is rated at 50 volts.

Operational amplifier 221 is used as part of a feedback loop to keep the current flowing through laser diode 1020 below a preset level by comparing a reference voltage with the voltage produced by the current flowing through resistor 107 and 111 in parallel. The preset level is set close to the maximum safe current capability of the laser diode. By providing a current close to this preset level, laser diode 1020 delivers the maximum energy to the ordnance without damaging the laser diode. In one embodiment, the amplifier in a MC33272 that uses pins 5 and 6 as inputs is used. The MC33272 is available from Motorola.

Operational amplifier 221, resistors 104 and 110, and capacitor 507 together form differential amplifier 1252.

Voltage reference diode 440 is used to help establish a reference voltage to operate the feedback loop properly. In one embodiment, a LM385 is used. This is available from National Semiconductor.

Resistors 103, 105 and 108 and capacitor 508 connect and bias the reference voltage to the differential amplifier. They also provide a filter to smooth the development of the reference voltage when the circuit has power applied to it. In one embodiment, resistor 105 is 10,000 ohms with 1% variation, and is rated at 0.1 watts. In one embodiment, resistor 108 is 2,740 ohms with 1% variation, and is rated at 0.1 watts. In one embodiment, capacitor 508 is 0.10 microfarads with 10% variation, and is rated at 50 volts.

The current limit depends on the characteristics of laser diode 1020. One way to set the current limit is to adjust resistors 107 and 111 in parallel. Another way to adjust the current limit is to adjust resistor 103 which will change the reference voltage at node 307. In one embodiment, resistor 103 is a trim resistor that can be adjusted to set the correct maximum current level through the laser diode. A typical range of values is from 100,000 ohms to 1,000,000 ohms. In that embodiment, resistor 103 has a 1% variation, and is rated at 0.1 watts.

Resistor 102 is used to drop the voltage from the value at node 310 to the constant level held by Voltage reference diode 440. In one embodiment, it is 10,000 ohms with a 1% variation, and is rated at 0.1 watts.

Transistor 203 is an N-channel MOSFET transistor that is used to force the reference voltage to zero quickly when power is being removed from the circuit. This causes the current passing through laser diode 1020 to drop directly to zero without any excess current spikes. In one embodiment, transistor 203 is a BSS138 available from Siemens.

Amplifier 220 is used as a comparator to determine when sufficient power is available to drive laser diode 1020 properly. If amplifier 220 detects that there is not enough power as indicated by a low voltage on the collector of transistor 201, it activates transistor 203 which forces the reference voltage at node 307 to a low value. In one embodiment, amplifier 220 is the amplifier that in a MC33272 uses pins 2 and 3 as inputs. The MC33272 is available from Motorola.

Amplifier 220, transistor 203, resistors 102, 103, 105, and 108, capacitor 508, and Voltage reference diode 440 together act to form reference voltage control circuit 1251.

Transistors 201 and 202 with their biasing resistors, operational amplifier 221, resistors 104, 107, 110, and 111, and capacitor 507 act together to form a feedback loop to limit the current flowing through laser diode 1020 to the maximum value defined by reference voltage control 1251.

The circuit operates in one of four modes: off, on, turn-on, and turn-off. The circuit is off when there no power is applied to connections 301, 304 and 305. Therefore, no current flows through laser diode 1020 when the circuit is off.

The circuit enters the turn-on-mode when power is initially applied to connections 301, 304, and 305. In one embodiment, the input signal provided by the electrical energy system is a periodic signal with a fundamental frequency of 100 kilohertz. A system suitable for providing such an input signal is disclosed in U.S. application Ser. No. 07/968358, filed Oct. 29, 1992 (now U.S. Pat. No. 5,291,829) and commonly assigned to Quantic Industries, the disclosure of which is hereby incorporated by reference.

During turn-on-mode, when capacitors 505, 506 and 509 are being charged, the reference voltage at node 307 needs to grow relatively slowly until there is sufficient voltage at connection 303 and node 310 to provide good current gain in transistors 201 and 202. This is so that the feedback loop formed by differential amplifier 1252, current amplifier 1254 and current detector 1253 will close. The RC filter formed by resistors 103, 105, and 108 and capacitor 508 smooths the development of the reference voltage at node 307 while the power increases. In addition, amplifier 220 and transistor 203 together also act to keep the reference voltage at node 307 at a low level until sufficient voltage is available at the collector of transistor 201 to provide adequate current gain in the feedback loop.

In the on-mode, voltage reference diode 440 acts as a constant voltage source that is used to set the reference voltage at node 307. In one embodiment, voltage reference diode 440 holds the voltage at 1.225 volts. Most of the current passing through laser diode 1020 also passes through the parallel combination of resistors 107 and 111. If, because of fluctuations in the input signal, that current decreases, the voltage appearing at node 311 decreases. The output of operational amplifier 221 is proportional to the difference between the reference voltage at node 307 and the voltage at node 311. Because of the decrease in voltage at node 311, the difference increases, and the output of operational amplifier 221 increases. Transistors 202 produces more current in response to that increase, and transistor 201 produces more current in response to 202. This corrects the effect of the initial current decrease. Similarly, if the current through the laser diode attempts to increase, the circuit reacts similarly, but oppositely, to decrease the current.

The network formed with resistors 104 and 110 and capacitor 507 act to control the voltage-to-current gain of the loop comprising operational amplifier 221, transistor 202, and transistor 201. This network also compensates the loop to prevent the loop from oscillating.

In the on-mode, amplifier 220, acting as a comparator, provides an output that responds to the difference between the constant voltage across voltage reference diode 440 and the voltage at connection 303. In on-mode, connection 303 will have a voltage above the threshold set by voltage reference diode 440. This will cause amplifier 220 to keep transistor 203 off.

Turn-off-mode begins when the power in the input signal drops. When the voltage at connection 303 falls below the constant voltage provided by voltage reference diode 440 in on-mode, amplifier 220, operating as a comparator, will respond to this by producing a positive signal. This will turn transistor 203 on. This forces the reference voltage at node 307 to a low level. This in turn causes the feedback loop to drive the current through laser diode 1020 to a low level.

It will be appreciated by those of ordinary skill in the art that many variations in the foregoing preferred embodiments are possible while remaining within the scope of the present invention. This application includes, but is not limited to laser diode devices for initiating ordnance, rocket motors, and other similar applications. The present invention should thus not be considered limited to the preferred embodiments or the specific choices of materials, configurations, dimensions, applications, or ranges of functional parameters employed therein.

What is claimed is:

1. A driver circuit for defining a controlled current flowing through a device in response to one or more input signals, said driver circuit comprising:
    a reference voltage control circuit for generating a reference signal from one or more input signals, said reference signal being a function of said one or more input signals;
    a current detector for producing a sense signal proportional to the amplitude of said controlled current;
    a differential amplifier for comparing said reference signal with said sense signal to produce a control signal proportional to the difference between said reference signal and said sense signal;
    a current amplifier that generates said controlled current from said control signal; and
    circuit output terminals at which said controlled current can be applied to said device.

2. The driver circuit of claim 1 wherein said device comprises a laser diode.

3. A driver circuit for defining a controlled current flowing through a device, said driver circuit having one or more raw input signals, said driver circuit comprising:
    an input smoothing circuit that converts said raw input signals into an identical number of smoothed input signals, by rectifying and filtering said raw input signals;
    a reference voltage control circuit for generating a reference signal from one or more smoothed input signals, said reference signal being a function of said smoothed input signals;
    a current detector for producing a sense signal proportional to the amplitude of said controlled current;
    a differential amplifier for comparing said reference signal with said sense signal to produce a control signal proportional to the difference between said reference signal and said sense signal;
    a current amplifier that generates said controlled current from said control signal; and
    circuit output terminals at which said controlled current can be applied to said device.

4. The driver circuit of claim 3 wherein said device comprises a laser diode.

5. The driver circuit of claims 3 or 4 wherein said input smoothing circuit comprises a full wave rectifier.

6. The driver circuit of claim 3 or 4 wherein said input smoothing circuit comprises a reactive load balancing circuit.

7. The driver circuit of claim 6 wherein said reactive load balancing circuit includes capacitors.

8. The driver circuit of claim 3 or 4 wherein said input smoothing circuit comprises a full wave rectifier and a reactive load balancing circuit.

9. The driver circuit of claim 8 wherein said reactive load balancing circuit includes capacitors.

10. A driver circuit, comprising:
    an input smoothing circuit having a first smoothed output and a second smoothed output;
    a device having an anode input connected to said first smoothed output and having a cathode output;
    a reference voltage control circuit having a source input, a detection input, a reference output, and a return output, with said source input coupled to said second smoothed output and said detection input connected to said cathode output;

a differential amplifier with a negative input, a positive input connected to said reference output, and an amplifier output;

a current amplifier with a control input connected to said amplifier output, a source input connected to said cathode output, and a current output; and a current detector with a current input connected to said current output, a sense output connected to said negative input, and a current return output connected to said return output.

11. The circuit of claim 10, wherein said reference voltage control circuit comprises:

a second amplifier with a second positive input connected to said source input and a second negative input connected to said detection input, and having a second amplifier output;

a voltage reference diode connected to said return output and said source input; and a transistor having a gate connected to said second amplifier output, a drain connected to said reference output, and a source connected to said return output.

12. The driver circuit of claims 10 or 11 wherein said input smoothing circuit comprises a full wave rectifier.

13. The driver circuit of claim 10 or 11 wherein said input smoothing circuit comprises a reactive load balancing circuit.

14. The driver circuit of claim 13 wherein said reactive load balancing circuit includes capacitors.

15. The driver circuit of claim 10 or 11 wherein said input smoothing circuit comprises a full wave rectifier and a reactive load balancing circuit.

16. The driver circuit of claim 15 wherein said reactive load balancing circuit includes capacitors.

17. A method of initiating current through a device without current spiking, said method comprising:

placing a driver circuit in an off state with no current flowing through said device and having a reference voltage at a small value;

applying an input waveform to said driver circuit;

holding said reference voltage at said small value until said input waveform reaches a threshold voltage;

thereafter increasing said reference voltage to a predetermined level; and increasing said current in proportion to the increase of said reference voltage.

18. The method of claim 17 wherein said driver circuit components and said device operate solely from energy provided by said input waveform.

19. The method of claims 17 or 18 wherein said reference voltage is held low with a comparator controlling a transistor.

20. A method of removing current passing through a device without current spiking, said method comprising:

placing a driver circuit in an on state with a current flowing through said device with an input waveform present and having a reference voltage at a given value;

removing said input waveform to said driver circuit;

detecting said removal of input waveform;

reducing said reference voltage to a small value in response to said detection; and thereafter, terminating said current in response to said reference voltage reduction.

21. The method of claim 20 wherein said driver circuit components and said device operate solely from energy provided by said input waveform.

22. The method of claims 20 or 21 wherein said reference voltage is generated by a comparator controlling a transistor.

* * * * *